United States Patent
Mande et al.

(10) Patent No.: US 10,210,164 B2
(45) Date of Patent: Feb. 19, 2019

(54) SYSTEMS AND METHODS FOR DATA ARCHIVAL

(71) Applicant: TATA CONSULTANCY SERVICES LIMITED, Mumbai, Maharashtra (IN)

(72) Inventors: Sharmila Shekhar Mande, Pune (IN); Anirban Dutta, Pune (IN); Tungadri Bose, Pune (IN); Mohammed Monzoorul Haque, Pune (IN)

(73) Assignee: TATA CONSULTANCY SERVICES LIMITED, Mumbai, Maharashtra (IN)

( * ) Notice: Subject to any disclaimer, the term of this patent is extended or adjusted under 35 U.S.C. 154(b) by 403 days.

(21) Appl. No.: 14/157,728

(22) Filed: Jan. 17, 2014

(65) Prior Publication Data
US 2014/0244592 A1 Aug. 28, 2014

(30) Foreign Application Priority Data
Feb. 26, 2013 (IN) .......................... 565/MUM/2013

(51) Int. Cl.
*G06F 17/30* (2006.01)
*H03M 7/30* (2006.01)

(52) U.S. Cl.
CPC .. *G06F 17/30073* (2013.01); *G06F 17/30153* (2013.01); *H03M 7/3059* (2013.01)

(58) Field of Classification Search
CPC ........ G06F 17/30073; G06F 17/30153; H03M 7/3059
See application file for complete search history.

(56) References Cited

U.S. PATENT DOCUMENTS

| 7,600,225 | B2* | 10/2009 | Sliger | G06F 8/68 707/999.202 |
|---|---|---|---|---|
| 2004/0032882 | A1* | 2/2004 | Kane | H04L 29/06 370/477 |
| 2008/0195677 | A1* | 8/2008 | Sudhakar | G06F 17/3023 |
| 2009/0164226 | A1* | 6/2009 | Boehm | G10L 19/24 704/500 |
| 2009/0300015 | A1* | 12/2009 | Kazan | H03M 7/30 |
| 2010/0042655 | A1* | 2/2010 | Tse | G06F 17/30082 707/694 |
| 2012/0310890 | A1 | 12/2012 | Dodd et al. | |

FOREIGN PATENT DOCUMENTS

EP    1396844 A1 *   3/2004   ......... G10L 19/0017

* cited by examiner

*Primary Examiner* — James E Richardson
(74) *Attorney, Agent, or Firm* — Drinker Biddle & Reath LLP

(57) ABSTRACT

The present subject matter discloses a system and a method for data archival. A data archiving system comprises a processor and a compression module coupled to the processor and configured to compress an original data file to generate, for each level of lossy compression, a compressed base file and a patch file. The base file is generated using a lossy compression technique. The patch file for a particular level of lossy compression is generated using information lost at the particular level of lossy compression. The data archiving system further comprises a data archiving module coupled to the processor. The data archiving system is configured to save a last base file and a plurality of patch files corresponding to each level of lossy compression, where the last base file is the base file corresponding to a last level of lossy compression.

18 Claims, 3 Drawing Sheets

SYSTEMS AND METHODS FOR DATA ARCHIVAL

TECHNICAL FIELD

The present subject matter relates, in general, to the field of data archival and, in particular, to systems and methods for data archival.

BACKGROUND

Data archiving typically includes saving a large amount of data in a database for future use. The data can be archived either in personal storage devices or in data repositories. The data repositories usually receive data from different users and store the data using various archiving techniques. Any user intending to use the data, as a whole or in part, may request the data repository for accessing the data. For instance, databases, such as movie databases, music databases, and data-repositories associated with research labs may store huge volumes of data for subsequent access by various users. The data in the data repositories typically extends into hundreds of terabytes (TB) and is thus usually stored in a compressed form.

SUMMARY

This summary is provided to introduce concepts related to a system and a method for data archival, which are further described below in the detailed description. This summary is not intended to identify essential features of the claimed subject matter nor is it intended for use in determining or limiting the scope of the claimed subject matter.

Method(s) and system(s) for data archival are described. In one embodiment, a data archiving system comprises a processor and a compression module coupled to the processor. The compression module is configured to compress an original data file to generate a base file and a patch file for each level of lossy compression. The base file is generated using a lossy compression technique. The patch file for a particular level of lossy compression is generated using information lost at the particular level of lossy compression. The data archiving system further comprises a data archiving module coupled to the processor. The data archiving system is configured to save a last base file and a plurality of patch files corresponding to each level of lossy compression, where the last base file is the base file corresponding to a last level of lossy compression.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components.

DETAILED DESCRIPTION

Figure 1A:
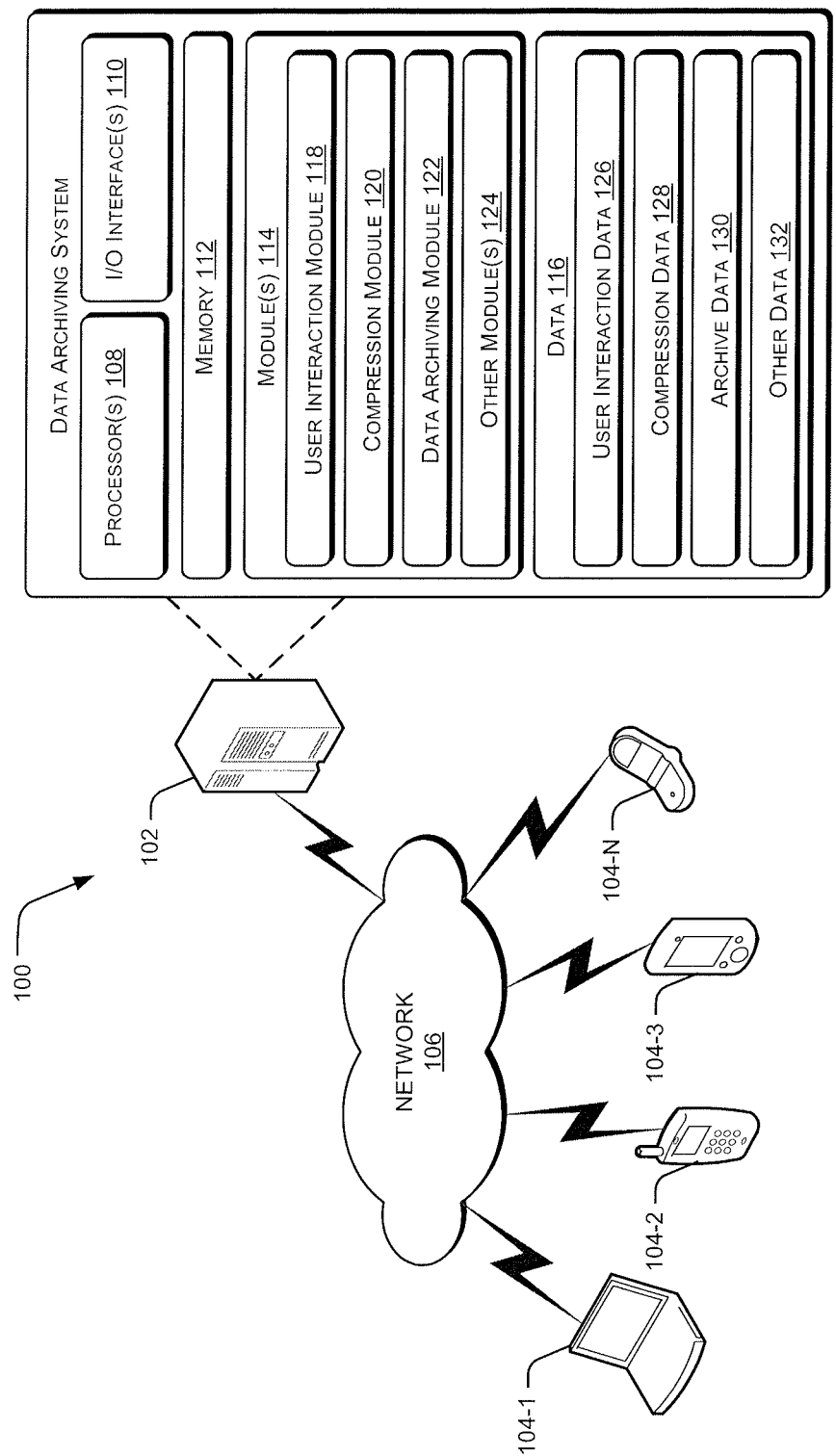
FIG. 1(a) illustrates a network environment implementing a data archiving system, in accordance with an embodiment of the present subject matter.

Systems and methods for data archiving are described herein. Generally, data, such as text document, video files, audio files, and genomic data are archived either in private storage devices or in data repositories for future use. The data repositories may be described as publicly accessible facilities used for archiving large volumes of data. The data repositories typically archive the data received from all users and provide the data to any user upon receiving a request for accessing the data. For instance, movie databases, music databases, and genomic data repositories may archive data provided by various users. However, owing to the large volumes of data, the data repositories typically need large storage disks having huge volumes of storage capacity. In order to increase the efficiency of the data repositories in storing the data and also to reduce costs related to the storage, the data is typically compressed before being stored.

Conventional compression methods employed by the data repositories or databases are based on either lossless compression techniques or lossy compression techniques. The lossy compression techniques may be described as compression techniques involving compression of an original data file in a predetermined way such that some information from the original data file is discarded during the process. Lossy compression thus results in the creation of a lossy compressed file that is relatively smaller in size as compared to a compressed file obtained using a lossless compression technique. As will be understood, in absence of the information discarded from the original data file during lossy compression, the original file can not be recovered in its entirety. Further, based on the amount of information discarded from the original data file, the lossy compression technique may be used to generate compressed files with different levels of information loss. For instance, a video file of high resolution may be compressed using the lossy compression technique to obtain a video file of low resolution such that the loss in resolution may not be perceivable by the user. In such example, some non-informative pixels may be discarded or some neighboring pixels may be merged, thereby compressing the video file to provide a low resolution video file. Further, decompressing files compressed using such lossy techniques often result in generation of files having less information as compared to the original data.

The lossless compression techniques, on the other hand, may be described as the compression techniques that involve compressing the original data file without any loss of data such that, upon decompression, an exact copy of the original data file may be obtained. For instance, decompressing the video file compressed using such technique may provide a high resolution video file that is identical to the original file. Archiving the data using lossless compression techniques may however require the repositories to have large storage capacities.

As the data is typically archived using only one of the compression techniques, the data repositories may not be able to simultaneously provide lossy compressed data and lossless compressed data of the same original data file to different users. The data repositories thus may either not be able to cater to all types of users or need to compress the original data file on-the-fly using the compression type requested by the user in case the original data file was archived using another compression technique. Alternatively, data repositories may archive both a lossless compressed variant and a lossy compressed variant of the original data file, which however may result in an increase in processing and storage costs for the data repositories. The costs may further increase in case the data repositories need to store multiple lossy compressed variants of the original data file corresponding to various levels of lossy compression, i.e., levels of information loss. Further, archiving data using the above techniques may also hinder user experience as a user having downloaded the lossy compressed variant may need to download the lossless compressed variant in case the user now needs the exact copy of the original data file, thus increasing overall data transmission and storage related costs of the user. The above techniques of data archival may thus hinder quick and efficient storage, retrieval, and transmission of the data.

The present subject matter describes methods and systems for data archival. The present subject matter facilitates efficient archival and dissemination of an original data file. According to an embodiment of the present subject matter, the original data file is received from a data-source, such as a user and archived using a lossy compression technique. The original data file is initially compressed to generate a plurality of base files and a plurality of patch files such that a base file and a patch file are generated for each level of lossy compression. Further, a data file may be compressed at different levels of lossy compression depending upon amount of information loss, i.e., amount of content discarded from the original data file during the lossy compression. Thus, for each level of lossy compression, the amount of information that is to be discarded may be defined. For example, a first level of lossy compression may have minimum information loss while a last level of lossy compression may have maximum information loss during the compression. The last level of lossy compression may be understood as the level up to which the lossy compression is to be performed to archive the original data file. In one implementation, the last level of lossy compression may be system or user defined. In another implementation, the last level of lossy compression may be the highest level up to which the lossy compression can be performed without making the base file unusable.

A base file for a particular level of compression may be defined as a compressed file obtained using the lossy compression technique. The base file may thus include reduced content of the original data file obtained after discarding certain information from the original data file based on predetermined rules. The patch file for the particular level of lossy compression may be defined as a compressed file having the information discarded or lost at the particular level of lossy compression. The base files and patch files for each of the levels of lossy compression may thus be generated based on the information required and lost, respectively, for the level. Further, the base files and patch files for each level of lossy compression may be obtained after discarding the certain information from the base file corresponding to the previous level of lossy compression.

A last base file, i.e., the base file corresponding to the last level of lossy compression and all the patch files may then be archived in the data repository for further use. It will be understood by a person skilled in the art that the last level of lossy compression may refer to level of lossy compression up to which the lossy compression is performed. Archiving all the patch files along with the last base file facilitates in obtaining the base files corresponding to other levels of lossy compression by combining the last base file with patch files of all the levels of lossy compression up to the level for which the data file is required. Thus, based on a user request for accessing a data file having data from the original data file compressed upto a particular level of lossy compression, the data repository may provide the last base file and the patch files corresponding to all levels of lossy compression beginning from the last level of lossy compression upto the particular level of lossy compression.

Further, the data repository may provide an instruction sheet and a file reconstructor along with the last base file and the patch files for reconstructing the original data file or lossy variants of the original data file with specified amounts of information loss. The file reconstructor may be understood as an application or an executable file that may be used by the user for reconstructing the data file using the base file and the patch files. In case the user needs to access the original data file or a data file with lesser level of information loss, the user may request the data repository to provide the remaining patch files for constructing the new data file.

The present subject matter thus provides systems and methods for optimum data archival and dissemination. Saving the base file and the patch files instead of the original data file or lossy data files for each level of lossy compression facilitates in saving the data storage space of the repositories. Further, saving the patch files for each level of lossy compression facilitates the data repositories in catering to all types of users as the data repository may provide the last base file and appropriate patch files to the users for reconstructing data files with the required level of information loss. Furthermore, providing the last base file and the patch files helps in reducing time taken by the data repositories in disseminating the data files as the data repositories now do not need to compress the data file in real time as per user requests. Additionally, providing the facility of accessing patch files and the last base file may facilitate the users as the users may download only the patch files as per the requirement thus saving their time, transmission costs, and storage space.

The above systems and methods are further described in conjunction with the following figures. It should be noted that the description and figures merely illustrate the principles of the present subject matter. Further, various arrangements may be devised that, although not explicitly described or shown herein, embody the principles of the present subject matter and are included within its spirit and scope. Furthermore, all examples recited herein are principally intended expressly to be for pedagogical purposes to aid the reader in understanding the principles of the present subject matter and the concepts contributed by the inventor(s) to furthering the art, and are to be construed as being without limitation to such specifically recited examples and conditions. Moreover, all statements herein reciting principles, aspects, and embodiments of the present subject matter, as well as specific examples thereof, are intended to encompass equivalents thereof.

Figure 1B:
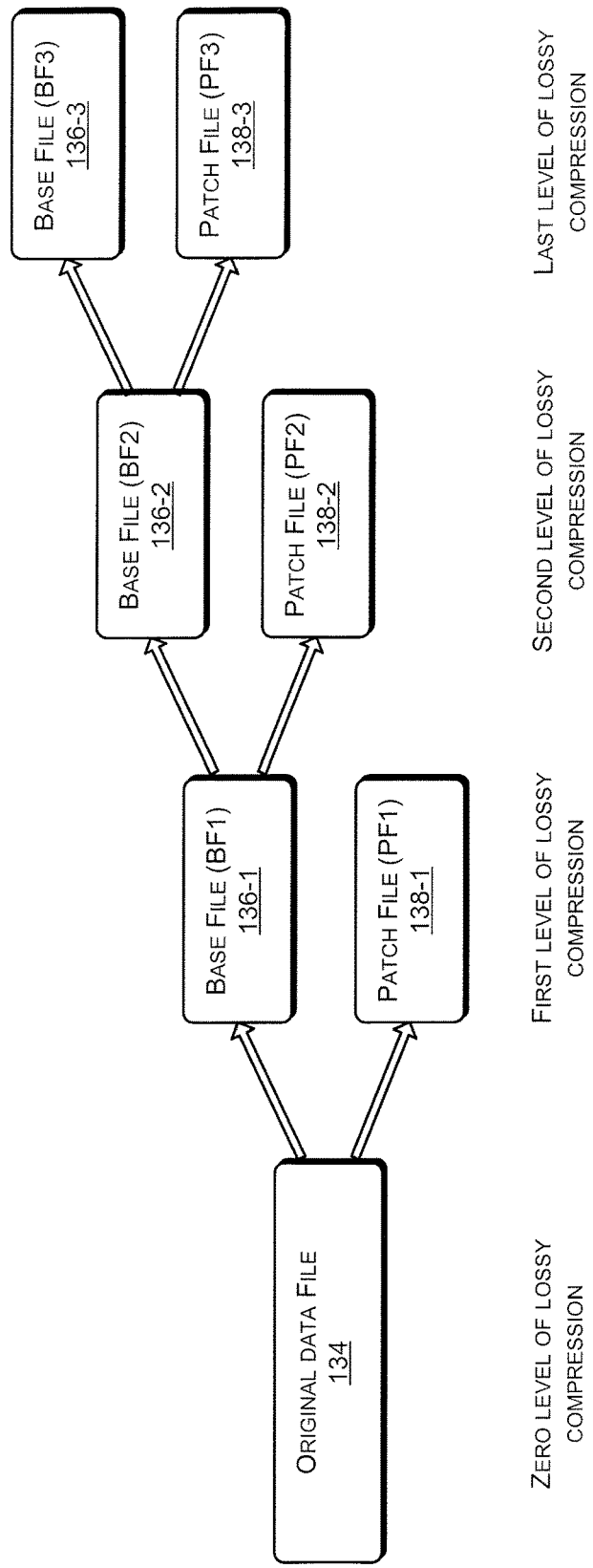
FIG. 1(b) illustrates a schematic representation of base files and patch files corresponding to different levels of lossy compression obtained using the data archiving system, according to an embodiment of the present subject matter.
Figure 2:
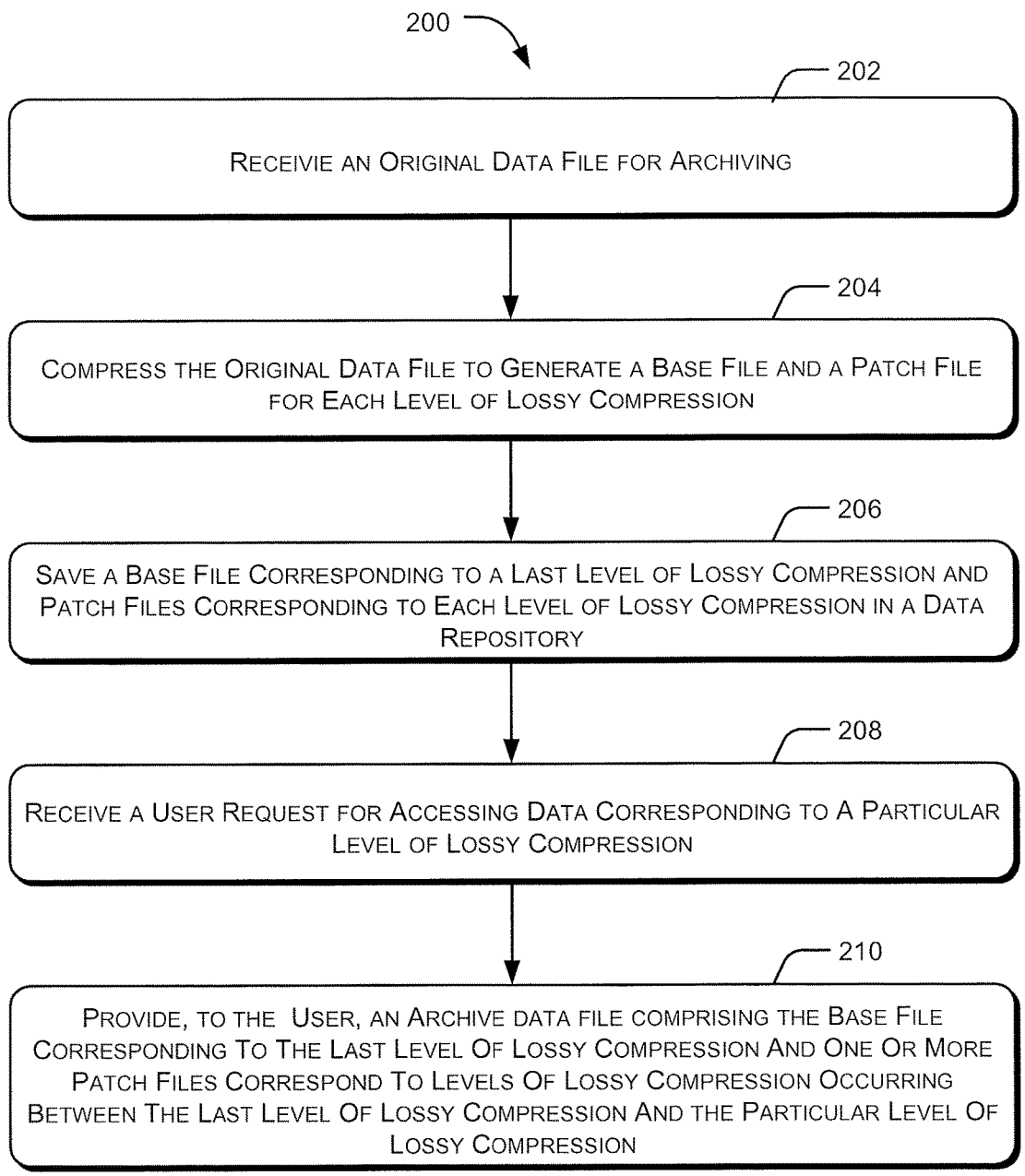
FIG. 2 illustrates a method for archiving data, in accordance with an embodiment of the present subject matter.

The manner in which the systems and the methods for data archiving are implemented is explained in detail with respect to FIGS. 1 and 2. While aspects of described systems and methods for data archiving can be implemented in any number of different computing systems, environments, and/or configurations, the embodiments are described in the context of the following system(s).

FIG. 1(*a*) illustrates a network environment 100 implementing a data archiving system 102, according to an implementation of the present subject matter. The network environment 100 may be a public networking environment or a private networking environment. The data archiving system 102, referred to as system 102 hereinafter, may be associated with a data repository and be configured to archive data received from users and disseminate compressed data to the users upon user request. The system 102 may be implemented in a variety of computing devices, including, servers, a desktop computer, a notebook or portable computer, a multiprocessor system, a workstation, a network computer, cloud servers, minicomputers, a mainframe computer, and a laptop.

The system 102 is communicatively connected to a plurality of user devices 104-1, 104-2, 104-3, . . . , and 104-N, collectively referred to as user devices 104 and individually referred to as a user device 104, through a network 106. It will be understood that the user devices 104 may be used by users to interact with the system 102 for either transmitting data files for archiving or accessing the archived files. The user devices 104 may be implemented in a variety of computing devices, including, servers, a desktop personal computer, a notebook or portable computer, a workstation, a mainframe computer, a laptop and/or communication device, such as mobile phones and smart phones. Further, in one implementation, the system 102 may be a distributed or a centralized network system in which different computing devices may host one or more of the hardware or software components of the system 102.

The user devices 104 are communicatively coupled to the system 102 over the network 106 through one or more communication links. The communication links between the user devices 104 and the system 102 may be enabled through a desired form of communication, for example, via dial-up modem connections, cable links, and digital subscriber lines (DSL), wireless or satellite links, or any other suitable form of communication through the network 106.

The network 106 may be a wireless network, a wired network, or a combination thereof. The network 106 can also be an individual network or a collection of many such individual networks, interconnected with each other and functioning as a single large network, e.g., the Internet or an intranet. The network 106 can include different types of networks, such as intranet, local area network (LAN), wide area network (WAN), the internet, and such. The network 106 may either be a dedicated network or a shared network, which represents an association of the different types of networks that use a variety of protocols, for example, Hypertext Transfer Protocol (HTTP), Transmission Control Protocol/Internet Protocol (TCP/IP), etc., to communicate with each other. The network 106 may also include individual networks, such as but not limited to, Global System for Communication (GSM) network, Universal Telecommunications System (UMTS) network, Long Term Evolution (LTE) network, etc. Depending on the terminology, the network 106 includes various network entities, such as base stations, gateways, and routers; however, such details have been omitted to maintain the brevity of the description. Further, it may be understood that the communication between the system 102, the user devices 104, and other entities may take place based on the communication protocol compatible with the network 106.

According to an embodiment of the present subject matter, the system 102 is associated with a data repository (not shown in the figure). The data repository may include data archived by various users for both personal and private uses. In one implementation, a user intending to save data may provide an original data file having the data to the system 102 through the user device 104. Upon receiving the original data file, the system 102 archives the original data file in the data repository. Further, the system 102 may disseminate the data upon receiving a request from the same user or other user. In one implementation, the system 102 includes processor(s) 108, I/O interface(s) 110, and a memory 112 coupled to the processor(s) 108.

The I/O interface(s) 110 may include a variety of software and hardware interfaces, for example, interfaces for peripheral device(s), such as a keyboard, a mouse, an external memory, and a printer. Further, the I/O interface(s) 110 may enable the system 102 to communicate with other devices, such as web servers and external databases. The I/O interface(s) 110 can facilitate multiple communications within a wide variety of networks and protocol types, including wired networks, for example, local area network (LAN), cable, etc., and wireless networks, such as Wireless LAN (WLAN), cellular, or satellite. For the purpose, the I/O interface(s) 110 may include one or more ports for connecting a number of computing systems with each other or to another server computer.

The processor(s) 108 can be a single processing unit or a number of units, all of which could include multiple computing units. The processor 108 may be implemented as one or more microprocessors, microcomputers, microcontrollers, digital signal processors, data processing units, state machines, logic circuitries, and/or any devices that manipulate signals based on operational instructions. Among other capabilities, the processor 108 is configured to fetch and execute computer-readable instructions and data stored in the memory 112.

The memory 112 may include any non-transitory computer-readable medium known in the art including, for example, volatile memory, such as static random access memory (SRAM) and dynamic random access memory (DRAM), and/or non-volatile memory, such as read only memory (ROM), erasable programmable ROM, flash memories, hard disks, optical disks, and magnetic tapes. In one implementation, the system 102 also includes module(s) 114 and data 116.

The module(s) 114, amongst other things, include routines, programs, objects, components, data structures, etc., which perform particular tasks or implement data types. The module(s) 114 may also be implemented as, signal processor(s), state machine(s), logic circuitries, and/or any other device or component that manipulate signals based on operational instructions.

Further, the module(s) 114 can be implemented in hardware, instructions executed by a processing unit, or by a combination thereof. The processing unit can comprise a computer, a processor, such as the processor 108, a state machine, a logic array or any other suitable devices capable of processing instructions. The processing unit can be a general-purpose processor which executes instructions to cause the general-purpose processor to perform the required tasks or, the processing unit can be dedicated to perform the required functions.

In another aspect of the present subject matter, the module(s) 114 may be machine-readable instructions (software) which, when executed by a processor/processing unit, perform any of the described functionalities. The machine-readable instructions may be stored on an electronic memory device, hard disk, optical disk or other machine-readable storage medium or non-transitory medium. In one implementation, the machine-readable instructions can also be downloaded to the storage medium via a network connection.

In one implementation, the module(s) 114 further include a user interaction module 118, a compression module 120, a data archiving module 122, and other module(s) 124. The other module(s) 124 may include programs or coded instructions that supplement applications and functions of the system 102. The data 116 serves, amongst other things, as a repository for storing data processed, received, and generated by one or more of the module(s) 114. The data 116 includes user interaction data 126, compression data 128, archive data 130, and other data 132. The other data 132 includes data generated as a result of the execution of one or more modules in the module(s) 114.

In one implementation, the user interaction module 118 is configured to receive the original data file from the user device 104 for being archived in the data repository associated with the system 102. Examples of the original file include, but are not limited to, a video file, an image file, a file including genomic data, an audio file, and a text file. The user interaction module 118 may save the original data file in the user interaction data 126 for being archived.

In one implementation, the original file may be initially compressed by the compression module 120. The compression module 120 may employ a lossy compression technique to compress the original data file. To obtain a compressed data file, the compression module 120 may process the original data file to generate a plurality of base files and a plurality of patch files. In one implementation, the compression module 120 may generate the plurality of base files and the plurality of patch files such that a base file and a patch file are generated for each level of lossy compression. At each level, some information from the original file may be discarded to obtain a lossy variant of the original file. For example, the compression module 120 may generate a base file corresponding to a particular level of lossy compression by discarding a predetermined amount of information from a base file corresponding to a previous level of lossy compression and generating a patch file corresponding to the particular level of lossy compression using the predetermined amount of information discarded from the base file corresponding to the previous level of lossy compression.

For the sake of explanation and not as a limitation, for a given level a discarded portion may be understood as a patch file while the lossy version of the original data file may be referred to as a base file. As will be appreciated by a person skilled in the art, the base files and the patch files may be further compressed using any known technique of lossless compression. Further, in one implementation, the compression module 120 may be configured to initially determine the information to be discarded as the patch file and retained for the base file for each of the level of lossy compression based on one or more predetermined rules using any known conventional method as will be appreciated by a person skilled in the art.

Further, levels of lossy compression may be described as different levels of compression at which the original data file can be compressed depending upon amount of information loss, i.e., amount of content discarded from the original data file during compression. In one implementation, the amount of information loss, as compared to the original data, may increase with each level of lossy compression. For example, for a first level of lossy compression, the compression module 120 may generate a base file with minimum information loss, while for a last level of lossy compression the compression module 120 may generate the base file with maximum information loss during compression. The size of the base file may thus decrease with the increase in the level of lossy compression beginning from the first level of lossy compression to the last level of lossy compression. The last level of lossy compression may be understood as the level up to which the lossy compression is to be performed to archive the original data file. In one implementation, the last level of lossy compression may be system or user defined. In another implementation, the last level of lossy compression may be the highest level up to which the lossy compression can be performed without making the base file unusable.

For instance, FIG. 1(b) illustrates base files and patch files corresponding to different levels of lossy compression obtained using the system 102, according to an embodiment of the present subject matter. As illustrated, an original data file 134 is compressed to obtain a plurality of base files 136-1, 136-2, and 136-3 and a plurality of patch files 138-1, 138-2, and 138-3. In one implementation, a first base file (BF1) 136-1 corresponds to a lossy compressed variant of the original data file 134 obtained for a first level of compression, while a first patch file 138-1 (PF1) corresponds to the compressed file having content discarded from the original data file 134 to obtain the first base file (BF1) 136-1. Similarly, a second base file (BF2) 136-2 corresponds to a lossy compressed variant of the first base file (BF1) 136-1 obtained for the second level of lossy compression of the original data file 134, while a second patch file (PF2) 138-2 corresponds to the compressed file having content discarded from the first base file (BF1) 136-1 to obtain the second base file (BF2) 136-2. Further, a last base file (BF3) 136-3 corresponds to a lossy compressed variant of the second base file (BF2) 136-2 obtained for the last level of lossy compression of the original data file 134, while a last patch file (PF3) 138-3 corresponds to the compressed file having content discarded from the second base file (BF2) 136-2 to obtain the last base file (BF3) 136-3. Further, as previously described, the size of the base files decreases with each level of lossy compression such that a size of BF3 is less than a size of BF2 and the size of BF2 is in turn less than a size of BF1.

For example, the system 102 may receive a video file as the original data file. Upon compressing the video file, the compression module 120 may generate a plurality of base files with varying resolutions depending upon the information loss and a plurality of patch files having resolution related content discarded at each level of lossy compression. For instance, upon compressing the video file for four levels of lossy compression the compression module 120 may generate four base files having different resolutions with the first base file having the highest resolution and the last base file having least resolution. The compression module 120 may further generate four patch files with each patch file having the resolution related content discarded at a corresponding level of lossy compression.

In another example, a genomic data file in a fastq file format may be obtained. As will be known, a fastq file includes multiple fastq records representing genomic data. A typical fastq record, includes four lines of text in which each fastq record typically begins with a sequence header followed by a genomic sequence, a quality header, and a quality sequence corresponding to the genomic sequence. The genomic sequence may include a plurality of primary characters representing useful information, such as nucleotide bases and one or more secondary characters. The sequence header includes information, such as an ID of the project for which the genomic sequence is generated and sequence ordering. The quality sequence includes a plurality of quality scores such that a particular quality score corresponds to a particular character in the genomic sequence, while the quality header may include information related to the quality sequence and may be similar to the sequence header. Thus, based on quality scores provided in the quality sequence, each fastq record may be either classified as low quality fastq records or as high quality fastq records. The fastq records having low quality may be subsequently removed from the fastq file in order to increase the overall quality of the fastq file. In one conventional way the classification may be performed by comparing the mean and standard deviation of quality values of the fastq record with a specified threshold value.

During the compression of the fastq file, the compression module 120 may generate a plurality of base files having fastq records with mean quality above particular threshold values, increasing from the first level to the last level of lossy compression. For instance, for three levels of lossy compression, the base file for first level of lossy compression may have the fastq file with fastq records having mean quality value above a low threshold value, say, 10. While the base file for last level of lossy compression may have the fastq file with fastq records above a high quality threshold value, say, 30. As will be understood by a person skilled in the art, the base file for the last level of lossy compression of the fastq file will have a higher quality and lower size as compared to the base file for first level of lossy compression.

Although, the FIG. 1(*b*) illustrates compressing the original data file 134 for three levels of lossy compression with the third level being the last level of lossy compression, it will be understood that the original data file 134 may be divided into more number of levels of lossy compression depending upon required or possible levels of information loss.

The plurality of base files and patch files thus generated may be saved by the compression module 120 in the compression data 128. The data archiving module 122 may subsequently save the last base file and all the patch files in the data repository. Saving only the last base file and the patch files may reduce the storage space required to archive the original data file. Further, archiving all the patch files and the last base file allows the system 102 in generating base files corresponding to any level of compression by combining the last base file with patch files of all the levels of compression up to the level for which the data file is required. Further, saving the last base file and the patch files also facilitates in lossless reconstruction of the original data file. For instance, for the original data file compressed using three levels of lossy compression, data files at different levels of lossy compression may be reconstructed using the last base file and the patch files as illustrated in table 1 below:

TABLE 1

| Data File desired for different levels of lossy compression | Base files and patch files needed for reconstructing the desired data file |
| --- | --- |
| Original Data file | (BF1 + PF1) or (BF2 + PF2 + PF1) or (BF3 + PF3 + PF2 + PF1) |
| BF1 | (BF2 + PF2) or (BF3 + PF3 + PF2) |
| BF2 | (BF3 + PF3) |

Thus, in the example illustrated in FIG. 1(*b*) the last base file (BF3) 136-3 when combined with the last patch file (PF3) 138-3 may generate the second base file (BF2) 136-2. Similarly, the second base file (BF2) 136-2 when combined with the second patch file (PF2) 138-2 may generate first base file (BF1) 136-1. Further, the first base file (BF1) 136-1 when combined with the first patch file (PF1) 138-1 may generate the original data file 134.

For instance, a user wishing to download the original data file with a predetermined amount of information loss may send, through the user device 104, a user request to the system 102. Upon receiving the user request, the user interaction module 118 may intimate the data archiving module 122 about the user's request. The data archiving module 122 may initially determine a particular level of lossy compression corresponding to the amount of information loss as desired by the user. Based on the particular level of lossy compression, say, a third level of lossy compression, the data archiving module 122 may generate an archive data file with the predetermined amount of information loss according to the particular level of lossy compression. For the purpose, the data archiving module 122 may obtain, from the data repository, the patch files corresponding to all the levels of lossy compression beginning from the last level of lossy compression up to the particular level of lossy compression. The data archiving module 122 may further obtain the last base file from the data repository.

Subsequently, the data archiving module 122 may generate an instruction sheet having instructions for the user for reconstructing the original data file with the predetermined amount of information loss. Further, the data archiving module 122 may save the archive data file having the base file, the patch files, and the instruction sheet in the archive data 130. The user interaction module 118 may subsequently provide the archive data file to the user, through the user device 104. In one implementation, the data archiving module 122 may be further configured to provide a file reconstructor along with the last base file, the patch files, and the instruction sheet for reconstructing the data file. The file reconstructor may be understood as an executable file that may be used by the user for reconstructing the data file using the base file and the patch files. In one example, the file reconstructor may be an application or an application widget that may be installed by the user on the user device 104 for reconstructing the file. In another example, the file reconstructor may be an executable file of a software that may be installed by the user on the user device 104 for reconstructing the file. The user interaction module 118 may thus provide the file reconstructor as a part of the archive data file to the user through the user device 104.

In another implementation, the user interaction module 118 may be configured to reconstruct the file on receiving a user's request and provide the reconstructed file to the user through the user device 104. Thus, the provision of providing the reconstructed file may add to user experience and convenience.

Validation and Results

For the purpose of validation, 11 genomic data sets in fastq format were obtained and archived by the system 102, in accordance with the present embodiment. Each of the 11 genomic data sets were initially converted into base files and patch files in accordance with the present subject matter. In one validation study, the base files and patch files for each of the 11 genomic data sets were subsequently compressed using Winzip compression technique. In another validation study, the Lempel-Ziv-Markov chain algorithm (LZMA) compression technique was used for compressing the base and patch files for each of the 11 genomic data sets. The results were further compared with conventional archival techniques. For the purpose, each of the 11 genomic data sets were directly compressed using the Winzip and the LZMA compression techniques without using the archival method of the present subject matter. The experiments were performed using a desktop having a dual core 2.33 gigahertz (Ghz) processor with 2 gigabytes (GB) RAM. The system 102 and the conventional techniques were used to archive the 11 genomic data sets and their results were evaluated using the size of the compressed files that needs to be stored in the data repository and the sizes of different data file archives that may be requested for and downloaded by the user. The download file size indicates size of the archived file downloaded by a user for various levels of lossy compression.

The experiments were conducted using 11 data sets obtained using Illumina, Roche, and Solid sequencing platforms. The files used for performance evaluation were downloaded from NCBI trace archive (ftp://ftp-trace.ncbi.nih.gov/1000genomes/ftp/data/). As previously described, each of the 11 data sets in the fastq format includes a plurality of fastq records that may be classified as high quality fastq records and low quality fastq records. The 11 data sets were subsequently compressed for three levels of lossy compression using the system 102 and the result set obtained using the system 102 included the base file corresponding to a third level of lossy compression and patch files corresponding to levels three, two, and one. Further, the base files obtained at each level differ based on the quality of the fastq records, while the patch files for each level of lossy compression may include the fastq records discarded from the fastq file for the corresponding level of lossy compression. For instance, the base file BF1 corresponding to first level of lossy compression may contain fastq records having mean quality values greater than or equal to a threshold value of 10, while the patch file PF1 contains low-quality fastq records having mean quality values less than 10. The base file BF2 corresponding to the second level of lossy compression may contain fastq records having mean quality values greater than or equal to a threshold value of 20, while the patch file PF2 contains low-quality fastq records having mean quality values greater than equal to 10 and less than 20. The base file BF3 corresponding to the last level of lossy compression may contain fastq records having mean quality values greater than or equal to a threshold value of 30, while the patch file PF3 contains low-quality fastq records having mean quality values greater than equal to 20 and less than 30.

Results obtained after compression of the various genomic data sets using the system 102 and the conventional technique are summarized in table 2. The base files and the patch files obtained for the 11 genomic data sets have been compressed using the LZMA technique to obtain the results for the current system 102. While the results for the conventional techniques include the 11 genomic data sets directly compressed using the LZMA technique without using the method of the system 102.

Further, results obtained after compression of the base files and the patch files for the various genomic data sets using the Winzip compression technique are summarized in table 3. The table 3 also illustrates results obtained after directly compressing the various genomic data sets using the conventional technique, i.e., the Winzip technique without using the method of the system 102.

TABLE 2

| | | | Size of files (in bytes) compressed using the system 102 | | | | |
|---|---|---|---|---|---|---|---|
| Sequencing Platform | Size of the original fastq file (in bytes) | Size of the compressed fastq file (in bytes) using conventional archival technique (LZMA) | Size of the compressed last Base File (BF3) | Size of compressed Patch file (PF3) corresponding to third (last) level of lossy compression | Size of compressed Patch file (PF2) corresponding to second level of lossy compression | Size of compressed Patch file (PF1) corresponding to first level of lossy compression | Cumulative size of data archived by data repositories (BF3 + PF3 + PF2 + PF1) |
| Illumina | 47018637 | 11208973 | 4684403 | 2636527 | 2449259 | 1476639 | 11246828 |
| | 3190655731 | 1113413268 | 86898239 | 323490634 | 528896953 | 159627762 | 1098913588 |
| | 4808574655 | 1392430855 | 222414442 | 864690719 | 254179038 | 49437633 | 1390721832 |
| | 4808574655 | 1425259044 | 328583718 | 885345442 | 176571889 | 31081323 | 1421582372 |
| | 2591422217 | 6870002347 | 4711908054 | 1216932359 | 525907250 | 424617257 | 6879364920 |
| Roche | 216482689 | 54213993 | 28336957 | 25187064 | 227437 | 104 | 53751562 |
| | 1196625057 | 311854991 | 27779496 | 282497294 | 563337 | 104 | 310840231 |
| | 886007841 | 245591506 | 2981397 | 240917382 | 1686705 | 104 | 245585588 |
| Solid | 695631390 | 147412168 | 948485 | 34485537 | 66650190 | 44015984 | 146100196 |
| | 2086802888 | 537188001 | 2554454 | 126561634 | 282925000 | 118592954 | 530634042 |
| | 43081717117 | 11309452999 | 377452840 | 1101840795 | 4533229010 | 5247513156 | 11260035801 |

TABLE 3

Size of files (in bytes) compressed using the system 102

| Sequencing Platform | Size of the original fastq file (in bytes) | Size of the compressed fastq file (in bytes) using conventional archival technique (Winzip) | Size of the compressed last Base File (BF3) | Size of compressed Patch file (PF3) corresponding to third (last) level of lossy compression | Size of compressed Patch file (PF2) corresponding to second level of lossy compression | Size of compressed Patch file (PF1) corresponding to first level of lossy compression | Cumulative size of data archived by data repositories (BF3 + PF3 + PF2 + PF1) |
|---|---|---|---|---|---|---|---|
| Illumina | 47018637 | 13607093 | 5292345 | 2933314 | 2757003 | 1691629 | 12674291 |
|  | 3190655731 | 1351124264 | 101376536 | 370531052 | 595579219 | 180578756 | 1248065563 |
|  | 4808574655 | 1710212000 | 252622137 | 974314481 | 286423537 | 56527593 | 1569887748 |
|  | 4808574655 | 1748312504 | 372361070 | 996357565 | 198782617 | 35550479 | 1603051731 |
|  | 25914222117 | 8492255430 | 5372681127 | 1366177316 | 593155032 | 492758823 | 7824772298 |
| Roche | 216482689 | 68781730 | 33972661 | 29497691 | 247299 | 98 | 63717749 |
|  | 1196625057 | 388822263 | 32431384 | 327129858 | 615304 | 98 | 360176644 |
|  | 886007841 | 305298884 | 3443898 | 279015110 | 1867745 | 98 | 284326851 |
| Solid | 695631390 | 171269984 | 979995 | 37995189 | 73603827 | 49017904 | 161596915 |
|  | 2086802888 | 615794213 | 2634678 | 138510894 | 309021874 | 130051932 | 580219378 |
|  | 43081717117 | 13226506118 | 421772339 | 5766940274 | 4948536852 | 1213411225 | 12350660690 |

Tables 2 and 3 indicate sizes of the final archived files for the various techniques. The tables also indicate the combined size of the last base file and the various patch files generated using the present subject matter.

As illustrated in tables 2 and 3, the cumulative size of all the files (base and patch files) archived using the system 102 are comparable to the size of the files archived using the conventional archival techniques. Archiving the original data files using the system 102 thus facilitates in selective retrieval of data at a desired level of information loss, without necessitating any additional storage space. The archival strategy also allows lossless reconstruction of the original file from the ensemble of base and patch files.

Further, the download file size obtained using the system 102 may be compared to obtain a percentage reduction in download file size with respect to files size obtained using conventional techniques for each genomic data set. As illustrated in tables 4 and 5, the download file size of the archived data files obtained for each level of lossy compression using the system 102 is significantly less compared to the download file size of the original data file as well as the original data file compressed using the conventional techniques, such as Winzip and LZMA techniques. For example, percentage download size of a fastq file (BF3) containing fastq records with mean quality value of greater than equal to 30 when compared to the original data file may vary in the range of around 0.5 to 69%. Thus, a user requiring data at this level of information loss may download the BF3 file and save a substantial amount of download time, transmission costs, and storage space. Such a decrease in download size may further benefit the data repository as providing archived files of smaller download size may save its bandwidth and transmission costs, and may also allow it to cater to many users at the same.

As previously discussed, a user requesting a fastq file having fastq records with mean quality value greater than or equal to 30 may be provided the base file BF3, while a user requesting a fastq file having fastq records with mean quality value greater than or equal to 20 may be provided an archive data file containing the base file BF3 and the patch file PF3. These files may be combined to generate the base file BF2. Similarly a user requesting a fastq file having fastq records with mean quality value greater than or equal to 10 may be provided with an archive data file containing the base file BF3 and the patch files PF3 and PF2 which may be combined to generate the base file BF1. Furthermore, a user requesting the original fastq file may be provided an archive data file containing the files BF3, PF3, PF2, and PF1, which may be combined to reconstruct the original fastq file. Further, the download sizes of the archive data files provided to the user for different levels of lossy compression, expressed as a percentage of the size of the original fastq file compressed using conventional compression techniques, have been depicted in brackets along with the respective download sizes, in tables 4 and 5.

TABLE 4

Download size of archive data files (in bytes) obtained using the system 102 and percentage size as compared to conventional technique

| Sequencing Platform | Size of the compressed fastq file (in bytes) using conventional archival technique (LZMA) | Size of the compressed file having information loss equal to third (last) level of lossy compression (BF3) | Size of the compressed file having information loss equal to second level of lossy compression (BF2 = BF3 + PF3) | Size of the compressed file having information loss equal to first level of lossy compression (BF1 = BF3 + PF3 + PF2) | Size of the compressed file with no information loss (Cumulative size of data archived by data repositories = BF3 + PF3 + PF2 + PF1) |
|---|---|---|---|---|---|
| Illumina | 11208973 | 4684403 (41.8) | 7320930 (65.3) | 9770189 (87.2) | 11246828 (100.3) |

TABLE 4-continued

Download size of archive data files (in bytes) obtained using the system 102 and percentage size as compared to conventional technique

| Sequencing Platform | Size of the compressed fastq file (in bytes) using conventional archival technique (LZMA) | Size of the compressed file having information loss equal to third (last) level of lossy compression (BF3) | Size of the compressed file having information loss equal to second level of lossy compression (BF2 = BF3 + PF3) | Size of the compressed file having information loss equal to first level of lossy compression (BF1 = BF3 + PF3 + PF2) | Size of the compressed file with no information loss (Cumulative size of data archived by data repositories = BF3 + PF3 + PF2 + PF1) |
|---|---|---|---|---|---|
|  | 1113413268 | 86898239 (7.8) | 410388873 (36.9) | 939285826 (84.4) | 1098913588 (98.7) |
|  | 1392430855 | 222414442 (16) | 1087105161 (78.1) | 1341284199 (96.3) | 1390721832 (99.9) |
|  | 1425259044 | 328583718 (23.1) | 1213929160 (85.2) | 1390501049 (97.6) | 1421582372 (99.7) |
|  | 6870002347 | 4711908054 (68.6) | 5928840413 (86.3) | 6454747663 (94) | 6879364920 (100.1) |
| Roche | 54213993 | 28336957 (52.3) | 53524021 (98.7) | 53751458 (99.1) | 53751562 (99.1) |
|  | 311854991 | 27779496 (8.9) | 310276790 (99.5) | 310840127 (99.7) | 310840231 (99.7) |
|  | 245591506 | 2981397 (1.2) | 243898779 (99.3) | 245585484 (100) | 245585588 (100) |
| Solid | 147412168 | 948485 (0.6) | 35434022 (24) | 102084212 (69.3) | 146100196 (99.1) |
|  | 537188001 | 2554454 (0.5) | 129116088 (24) | 412041088 (76.7) | 530634042 (98.8) |
|  | 11309452999 | 377452840 (3.3) | 1479293635 (13.1) | 6012522645 (53.2) | 11260035801 (99.6) |

TABLE 5

Download size of archive data files (in bytes) obtained using the system 102 and percentage size as compared to conventional technique

| Sequencing Platform | Size of the compressed fastq file (in bytes) using conventional archival technique (Winzip) | Size of the compressed file having information loss equal to third (last) level of lossy compression (BF3) | Size of the compressed file having information loss equal to second level of lossy compression (BF2 = BF3 + PF3) | Size of the compressed file having information loss equal to first level of lossy compression (BF1 = BF3 + PF3 + PF2) | Size of the compressed file with no information loss (Cumulative size of data archived by data repositories = BF3 + PF3 + PF2 + PF1) |
|---|---|---|---|---|---|
| Illumina | 13607093 | 5292345 (38.9) | 8225659 (60.5) | 10982662 (80.7) | 12674291 (93.1) |
|  | 1351124264 | 101376536 (7.5) | 471907588 (34.9) | 1067486807 (79.0) | 1248065563 (92.4) |
|  | 1710212000 | 252622137 (14.8) | 1226936618 (71.7) | 1513360155 (88.5) | 1569887748 (91.8) |
|  | 1748312504 | 372361070 (21.3) | 1368718635 (78.3) | 1567501252 (89.7) | 1603051731 (91.7) |
|  | 8492255430 | 5372681127 (63.3) | 6738858443 (79.4) | 7332013475 (86.3) | 7824772298 (92.1) |
| Roche | 68781730 | 33972661 (49.4) | 63470352 (92.3) | 63717651 (92.6) | 63717749 (92.6) |
|  | 388822263 | 32431384 (8.3) | 359561242 (92.5) | 360176546 (92.6) | 360176644 (92.6) |
|  | 305298884 | 3443898 (1.1) | 282459008 (92.5) | 284326753 (93.1) | 284326851 (93.1) |
| Solid | 171269984 | 979995 (0.6) | 38975184 (22.8) | 112579011 (65.7) | 161596915 (94.4) |
|  | 615794213 | 2634678 (0.4) | 141145572 (22.9) | 450167446 (73.1) | 580219378 (94.2) |
|  | 13226506118 | 421772339 (3.2) | 6188712613 (46.8) | 11137249465 (84.2) | 12350660690 (93.4) |

Tables 4 and 5 indicate download size of the archive data files for different levels of lossy compression. As can be seen from the tables 4 and 5, the sizes of the archive data files that may be downloaded using the system 102 progressively decreases for increasing levels of information loss. Moreover, the cumulative size of the last base file and all the patch files archived using the system 102 is comparable to the original data file compressed using conventional archival techniques. Downloading the files archived using the system 102 thus saves download costs and time for the user as the user needs to download only those archive data files that have data good enough for their use. Further, archiving the original data file in the form of base files and patch files facilitates the system 102 in providing, on-the-fly, archived files to all types of users at the desired level of information loss.

FIG. 2 illustrates a method 200 for archiving data, in accordance with an implementation of the present subject matter. The method 200 is implemented in computing device, such as the system 102. The method may be described in the general context of computer executable instructions. Generally, computer executable instructions can include routines, programs, objects, components, data structures, procedures, modules, functions, etc., that perform particular functions or implement particular abstract data types. The method may also be practiced in a distributed computing environment where functions are performed by remote processing devices that are linked through a communications network.

The order in which the method is described is not intended to be construed as a limitation, and any number of the described method blocks can be combined in any suitable order to implement the method, or an alternative method. Additionally, individual blocks may be suitably deleted from the method without departing from the spirit and scope of the subject matter described herein. Furthermore, the method can be implemented in any suitable hardware, software, firmware, or combination thereof.

At block 202, an original data file to be compressed is received, for example, by the system 102. The original data file may be, for example, a text document, a video file, an audio file, an image file, or a genomic data file. In an implementation, the original data file may be stored in the user interaction data 126.

At block 204, the original data file is compressed to generate, for each level of lossy compression, a compressed base file and a patch file. In one implementation, the base file may be generated by compressing the original data file using a lossy compression technique. The patch file, for a given level, may be generated using information lost at that level of lossy compression. Further, levels of lossy compression may be described as different levels at which a data file can be compressed depending upon amount of information loss, i.e., amount of the information discarded from the original data file during lossy compression. Thus, in case a file needs to be compressed up to four levels of lossy compression, the system 102 may obtain 4 base files and 4 patch files. In an implementation, the compression module 120 may generate the base files and the patch files and save the same in the compression data 128.

At block 206, a base file corresponding to a last level of lossy compression and a plurality of patch files corresponding to each level of lossy compression are saved. In an implementation, the data archiving module 122 may save the base file and the patch files in a data repository associated with the system 102.

At block 208, a user request for accessing data corresponding to a particular level of lossy compression is received. In an implementation, the user interaction module 118 may receive the user request from a user through the user device 104. The user request may indicate the user's wish to download a data file with predetermined amount of information loss. The user interaction module 118 may save the user request in the user interaction data 126.

At block 210, an archive data file corresponding to the particular level of lossy compression is provided to the user. In one implementation, the archive data file may include a base file corresponding to a last level of lossy compression and patch files corresponding to levels of lossy compression occurring between the last level of lossy compression and the particular level of lossy compression. Further, the archive data file may include a file reconstructor for reconstructing the original data file with predetermined amount of information loss and an instruction sheet having instructions for the user for generating the original data file using the file reconstructor, the base file, and the patch files. In one implementation, the file reconstructor may be provided separately from the archive data file based on user requests.

Although embodiments for a system and a method for data archival have been described in language specific to structural features and/or methods, it is to be understood that the subject matter is not necessarily limited to the specific features or methods described. Rather, the specific features and methods are disclosed as exemplary embodiments for the system and method for data archival.

We claim:

1. A data archiving system comprising:
a processor;
a compression module coupled to the processor, the compression module configured to:
compress an original data file to generate a base file and a patch file for each level of a plurality of levels of a lossy compression to obtain a plurality of base files and a plurality of patch files, respectively, wherein the base file is generated using information to be retained for a particular level of the lossy compression by performing a lossy compression technique and the patch file is generated using information to be lost for the particular level of lossy compression, wherein the information to be retained and the information to be lost is determined based on one or more predetermined rules, and
wherein the one or more predetermined rules comprises one or more features associated with the original data file, the plurality of base files, and the plurality of patch files; and
a data archiving module coupled to the processor, the data archiving module configured to:
save a last base file and the plurality of patch files without saving the original data file, wherein the last base file is a base file corresponding to a last level of lossy compression, wherein saving the last base file and the plurality of patch files facilitates a lossless reconstruction of the original data file, and wherein a cumulative size of the saved last base file and the plurality of patch files is less than a size of the original data file;
generate an archive data file comprising the saved last base file and one or more patch files from the saved plurality of patch files; and
disseminate one of a lossy compressed original data file or compressed original data file in the form of the archive data file, wherein the lossy compressed original data file corresponds to the particular level of lossy compression.

2. The data archiving system as claimed in claim 1, wherein one of the last base file and the one or more patch files is selected from the plurality of patch files based on a user's request for accessing the archive data file in real time corresponding to the particular level of lossy compression, and wherein the one or more patch files includes a patch file corresponding to the last level of compression.

3. The data archiving system as claimed in claim 2, wherein the archive data file includes an instruction sheet having instructions for constructing the original data file with a predetermined amount of information loss using the archive data file.

4. The data archiving system as claimed in claim 3, wherein the archive data file includes a file reconstructor configured to reconstruct the original data file with a predetermined amount of information loss using the archive data file.

5. The data archiving system as claimed in claim 1, wherein the archive data file comprises the last base file based on a user's request for accessing the archive data file corresponding to the particular level of lossy compression.

6. The data archiving system as claimed in claim 5, wherein the archive data file includes an instruction sheet having instructions for constructing the original data file with a predetermined amount of information loss using the archive data file.

7. The data archiving system as claimed in claim 6, wherein the archive data file includes a file reconstructor configured to reconstruct the original data file with a predetermined amount of information loss using the archive data file.

8. The data archiving system as claimed in claim 1, further comprising a user interaction module coupled to the processor, the user interaction module configured to:
receive a user request from a user for accessing an archive data file corresponding to a particular level of lossy compression; and
provide the archive data file to the user based on the user request, wherein the archive data file comprises one of the last base file and a combination of the last base file and one or more patch files selected from among the plurality of patch files.

9. The data archiving system as claimed in claim 1, further comprising a user interaction module coupled to the processor, the user interaction module configured to:
receive a user request from a user for accessing the original data file with a predetermined amount of information loss corresponding to a particular level of lossy compression;
reconstruct the original data file with the predetermined amount of information loss using one of the last base file and a combination of the last base file and one or more patch files selected from among the plurality of patch files; and
provide the reconstructed file to the user.

10. The data archiving system as claimed in claim 1, wherein the compression module is configured to:
generate a base file corresponding to a particular level of lossy compression by discarding a predetermined amount of information from a base file corresponding to a previous level of lossy compression; and
generate a patch file corresponding to the particular level of lossy compression using the predetermined amount of information discarded from the base file corresponding to the previous level of lossy compression.

11. A method for data archival comprising:
compressing an original data file to generate a base file and a patch file for each level of a plurality of levels of a lossy compression to obtain a plurality of base files and a plurality of patch files, respectively, wherein the base file is generated using information to be retained for a particular level of the lossy compression by performing a lossy compression technique and the patch file is generated using information to be lost for the particular level of lossy compression, wherein the information to be retained and the information to be lost is determined based on one or more predetermined rules, and wherein the one or more predetermined rules comprises one or more features associated with the original data file, the plurality of base files, and the plurality of patch files;
saving a last base file and the plurality of patch files without saving the original data file, wherein the last base file is a base file corresponding to a last level of lossy compression, wherein saving the last base file and the plurality patch files facilitates a lossless compressed version of the original data file, and wherein a cumulative size of the saved last base file and the plurality patch files is less than a size of the original data file;
generating an archive data file comprising the saved last base file and one or more patch files from the saved plurality of patch files; and
disseminating one of a lossy compressed original data file or compressed original data file in the form of the archive data file, wherein the lossy compressed original data file corresponds to the particular level of lossy compression.

12. The method as claimed in claim 11, further comprising, receiving a user request from a user for accessing an archive data file corresponding to a particular level of lossy compression.

13. The method as claimed in claim 12, further comprising generating the archive data file based on the particular level of lossy compression, wherein the archive data file comprises one of the last base file and a combination of the last base file and one or more patch files selected from among the plurality of patch files.

14. The method as claimed in claim 12, further comprising providing, to the user, the archive data file comprising one of the last base file and a combination of the last base file and at least one patch file, wherein the at least one patch file is selected from among the plurality of patch files based on the particular level of lossy compression.

15. The method as claimed in claim 14, wherein the providing further comprises providing a file reconstructor and an instruction sheet, and wherein the file reconstructor is configured to construct the original data file with a predetermined amount of information loss using the last base file and the at least one patch file, and wherein the instruction sheet includes instructions for the reconstruction.

16. The method as claimed in claim 11, further comprising receiving the original data file from a user for archiving in a data repository.

17. A non-transitory computer-readable medium having embodied thereon a computer program for executing a method for data, archival, the method comprising:
receiving an original data file for archiving;
compressing the original data file to generate a base file and a patch file for each level of a plurality of levels of a lossy compression to obtain a plurality of based files and a plurality of patch files, respectively, wherein the base file is generated using information to be retained for a particular level of the lossy compression by performing a lossy compression technique and the patch file is generated using information to be lost for the particular level of lossy compression, wherein the information to be retained and the information to be lost is determined based on one or more predetermined rules, and wherein the one or more predetermined rules comprises one or more features associated with the original data file, the plurality of base files and the plurality of patch files;

saving a last base file and the plurality of patch files without saving the original data file, wherein the last base file is a base file corresponding to a last level of lossy compression, and wherein a cumulative size of the saved last base file and the plurality patch files is less than a size of the original data file and a lossless compressed version of the original data file;

generating an archive data file comprising the saved last base file and one or more patch files from the saved plurality of patch files;

disseminating one of a lossy compressed original data file or compressed original data file in the form of the archive data file, wherein the lossy compressed original data file corresponds to the particular level of lossy compression; and providing the archive data file to the user based upon a user request.

18. The non-transitory computer-readable medium for executing the method as claimed in claim 17, the wherein the providing further comprises providing a file reconstructor and an instruction sheet, and wherein the file reconstructor is configured to construct the original data file with a predetermined amount of information loss using the last base file and the at least one patch file, and wherein the instruction sheet includes instructions for the reconstruction.

* * * * *